United States Patent
Sakamoto

[11] Patent Number: 6,162,990
[45] Date of Patent: Dec. 19, 2000

[54] ELECTRICAL JUNCTION BOX FOR WIRING AN AUTOMOBILE

[75] Inventor: Masami Sakamoto, Shizuoka, Japan

[73] Assignee: Yazaki Corporation, Tokyo, Japan

[21] Appl. No.: 08/928,460

[22] Filed: Sep. 12, 1997

Related U.S. Application Data

[63] Continuation of application No. 08/497,796, Jul. 3, 1995, abandoned.

[30] Foreign Application Priority Data

Jul. 5, 1994 [JP] Japan .................................. 6-153773

[51] Int. Cl.[7] ................................................... H01R 13/46
[52] U.S. Cl. ........................................... 174/59; 439/76.2
[58] Field of Search .................... 174/52.1, 59; 439/76.2, 439/620, 621, 622; 361/611, 624, 648, 775

[56] References Cited

U.S. PATENT DOCUMENTS

| | | | |
|---|---|---|---|
| 4,781,660 | 11/1988 | Amataka et al. | 474/174 |
| 4,944,684 | 7/1990 | Leibowitz | 439/76 |
| 5,011,417 | 4/1991 | Matsumoto et al. | 439/76 |
| 5,023,752 | 6/1991 | Detter et al. | 361/399 |
| 5,057,026 | 10/1991 | Sawai et al. | 439/76 |
| 5,082,463 | 1/1992 | Saimoto | 439/883 |
| 5,207,587 | 5/1993 | Hamill et al. | 439/76.2 |
| 5,295,842 | 3/1994 | Ozaki et al. | 439/76 |
| 5,353,190 | 10/1994 | Nakayama et al. | 361/641 |

FOREIGN PATENT DOCUMENTS

| | | | |
|---|---|---|---|
| 0195955 | 10/1986 | European Pat. Off. . | |
| 59-15215 | 1/1984 | Japan | H02G 3/16 |
| 61-129413 | 8/1986 | Japan | H02G 3/08 |
| 4137429 | 12/1992 | Japan | H02G 3/16 |

*Primary Examiner*—Hyung-Sub Sough
*Assistant Examiner*—Hung V Ngo
*Attorney, Agent, or Firm*—Sughrue, Mion, Zinn, Macpeak & Seas, PLLC

[57] ABSTRACT

An electrical junction box provided for wiring up an automobile. In the electrical junction box, a plurality of bus bars and a wiring board are accommodated in a main cover and an under cover, and tabs raised from the bus bars are inserted into connector mounting frames formed on the main cover and the under cover. One of the tabs is long, and the connector mounting frame of the under cover has a length which makes constant a depth of a recess formed by the connector mounting frame when the bus bar having the long tab is mounted.

15 Claims, 7 Drawing Sheets und6,162,990

ELECTRICAL JUNCTION BOX FOR WIRING AN AUTOMOBILE

This is a Continuation of application Ser. No. 08/497,796 filed Jul. 3, 1995, now abandoned.

BACKGROUND OF THE INVENTION

1. Field of the Invention

This invention relates to an electrical junction box, and more particularly to an electrical junction box provided for wiring up an automobile.

2. Description of the Related Art

In wiring up an automobile, in order to simplify the wiring of the wire harnesses, an electrical junction box is used which is to collectively arrange relays and fuses. In the electrical junction box, circuits made up of bus bars formed by pressing copper or brass plates are provided in a plurality of layers.

In the electrical junction box, a wiring board which is an insulated substrate is provided, and a tab raised at one end of a bus bar arranged on the wiring board is inserted in a connector mounting section of a main cover, and another tab raised at the other end of the bus bar is passed through the wiring board and inserted in a connector mounting section of an under cover.

Recently, automobiles have been markedly improved in performance, and accordingly increased in the number of electrical components, and in the number of circuits to be held in an electrical junction box. Hence, depending on the model or grade of an automobile, it is often necessary to change the electrical circuit of the electrical junction box. In such a case, heretofore an electrical junction box is newly prepared which has bus bars specially designed for the circuit thus changed.

However, the above-described conventional electrical junction box suffers from the following difficulties: That is, in order to form the required electrical junction box, components for realizing the given circuit must be newly arranged, and particularly the bus bars specially designed therefor must be newly manufactured. Thus, the employment of the conventional electrical junction box is not practical in the saving of cost and time.

On the other hand, a technique is known in the art that a main electrical junction box having a fundamental circuit is connected to an auxiliary electrical junction box, to increase the electrical function thereof. However, the technique is disadvantageous in that the electrical junction boxes each has a relatively large unwanted space, and occupy a relatively large installation space.

SUMMARY OF THE INVENTION

Accordingly, an object of the invention is to eliminate the above-described difficulties accompanying a conventional electrical junction box. More particularly, an object of the invention is to provide an electrical junction box for wiring up an automobile of which the electrical circuit can be increased or decreased in function with components used in common so that the electrical junction box is applicable to a different model of an automobile having a different electrical circuit.

In order to attain the above object, the invention provides an electrical junction box including: a wiring board; a plurality of bus bars arranged on the wiring board and each having at least one tab raised from the bus bar; a main cover having a connector mounting frame into which the tab of at least one of the plurality of bus bars is inserted; and an under cover having a connector mounting frame into which the tab of another of the plurality of bus bars is inserted, wherein a length of the connector mounting frame of the main cover or the under cover and a length of the tab of the bus bar to be mounted are set so as to make constant a depth of a recess of the connector mounting frame and a length of an exposed part of the tab in the recess when the bus bar is mounted.

DETAILED DESCRIPTION OF THE PREFERRED EMBODIMENTS

Preferred embodiments of the invention will be described with reference to FIGS. 1 through 8(c).

Figure 1:
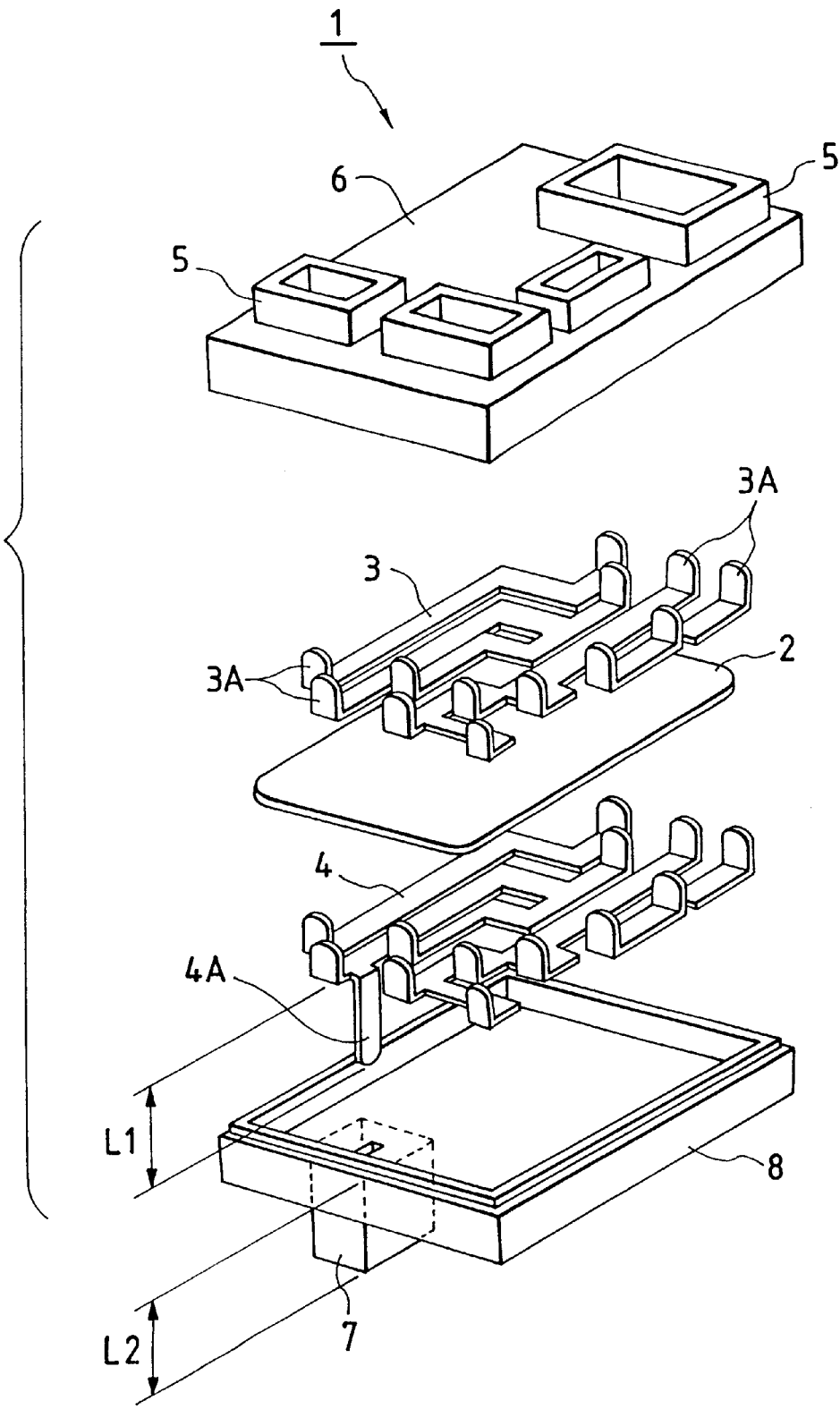
FIG. 1 an exploded perspective view showing an example of a electrical junction box, which constitutes a first embodiment of the invention.
Figure 2:
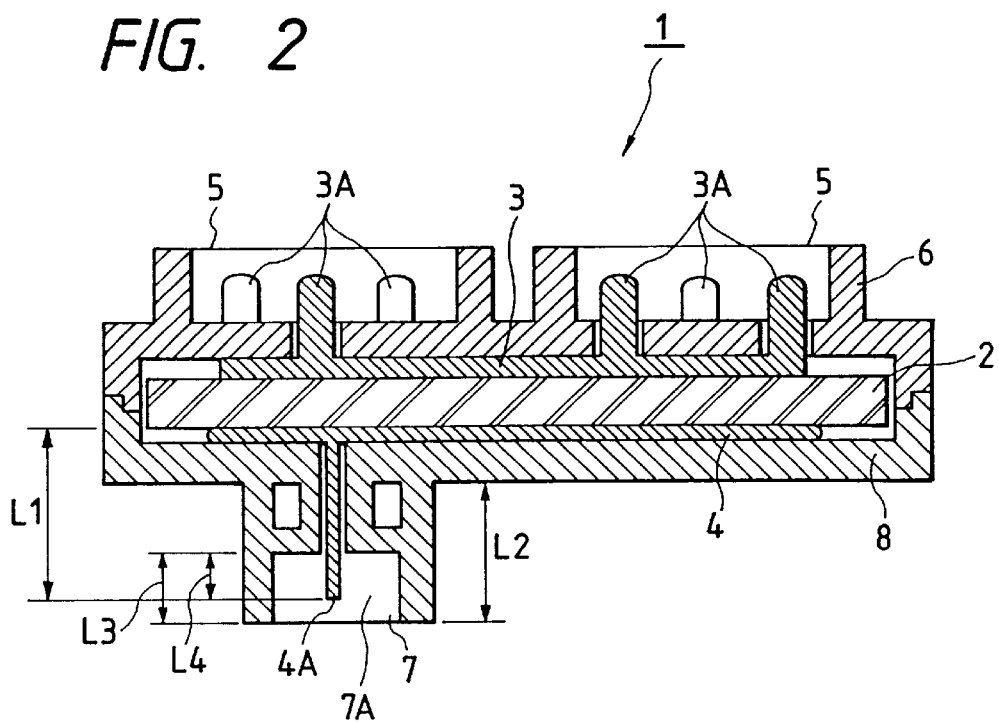
FIG. 2 This a sectional view of the electrical junction box shown in FIG. 1.

FIG. 1 is an exploded perspective view showing an example of an electrical junction box, which constitutes a first embodiment of the invention, and FIG. 2 is a sectional view of the electrical junction box. In FIGS. 1 and 2, reference numeral 1 designates the electrical junction box according to the invention which is applied to an automobile having the fundamental functions. The electrical junction box 1, as shown in FIGS. 1 and 2, includes: a wiring board 2; bus bars 3 and 4 provided on both sides of the wiring board 2; and a main cover 6 and an under cover 8 which accommodate the wiring board 2 and the bus bars 3 and 4. The wiring board 2, and the bus bars 3 and 4 form a common electrical circuit.

On the upper surface of the main cover 6, a plurality of connector mounting frames 5 are formed in such a manner that they are opened upwardly to receive relays or fuses (not shown). The bus bars 3 have a plurality of tabs 3A raised upwardly. Those tabs 3A are inserted into the connector mounting frames 5 when the wiring board 2 and the bus bars 3 are accommodated in the main cover 6.

On the other hand, on the lower surface of the under cover 8, a connector mounting frame 7 is formed which is opened downwardly to receive a male connector (not shown). The bus bars 4 have tabs 4A, one of which is extended downwardly. The downwardly extended tab 4A is inserted into the connector mounting frame 7 when the bus bar assembly is accommodated in the under cover 8.

The length L1 of that tab 4A is set to a sufficiently large value. The connector mounting frame 7 has a raised bottom, and is elongated downwardly; that is, its height is set to a value L2 which is sufficiently large in correspondence to the long tab 4A. That is, as shown in FIG. 2, the tab 4A is exposed partially by a predetermined distance L4 in a recess 7A which is formed by the connector mounting frame 7 to a predetermined depth L3.

Figure 2A:
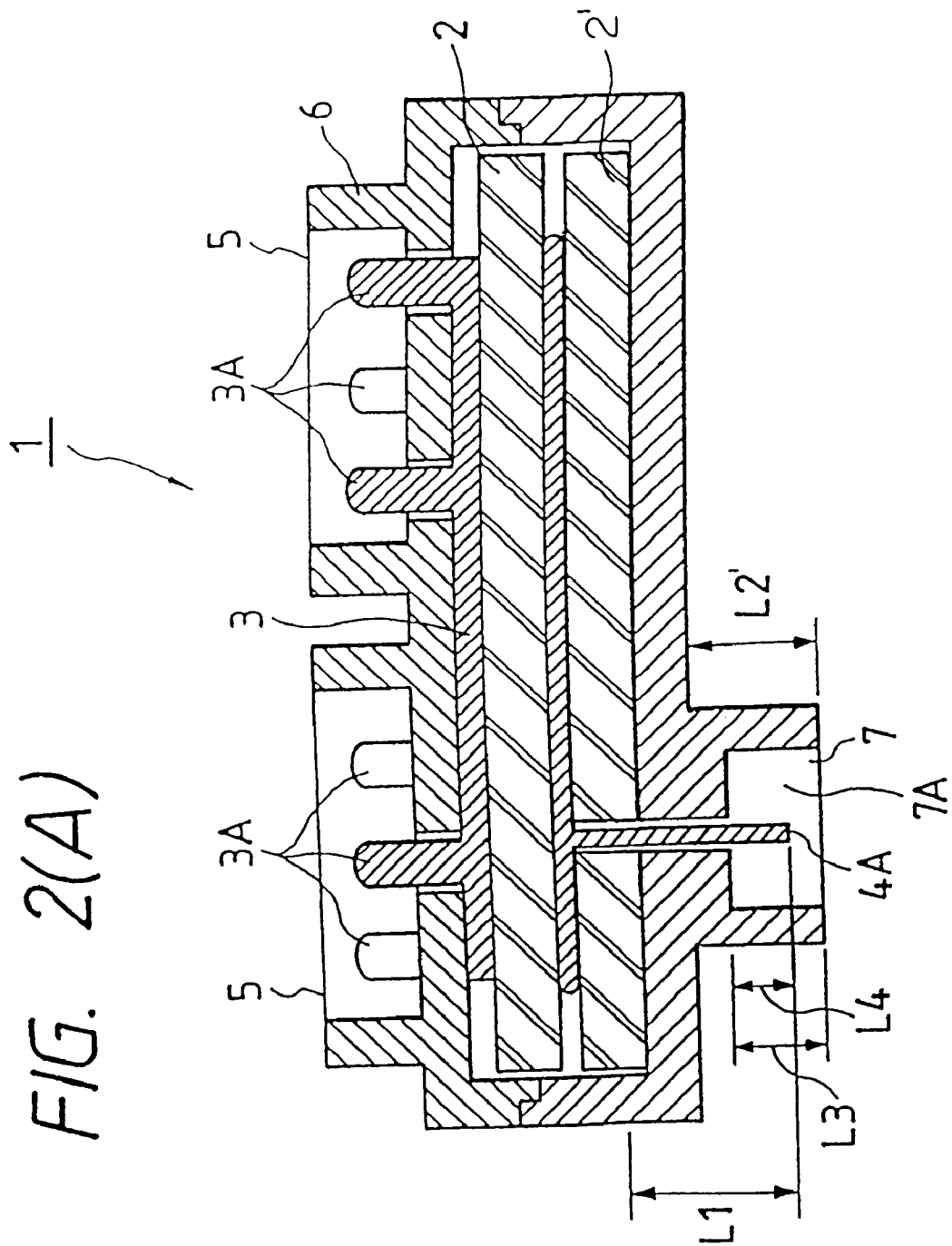
FIG. 2(A) is a sectional view similar to FIG. 2, but including an additional wiring board.

The first embodiment is designed as described above. Hence, in the case where it is used for a different model of an automobile; for instance, as shown in FIG. 2(A), a wiring board 2' and/or bus bars are additionally provided below the wiring board 2, so that the under cover is larger in component accommodating space, and accordingly the length 2' (corresponding to L2) of the connector mounting frame is smaller, the bus bar 4 with the tab 4A having the length L1 can be used as it is. That is, even when the model of an automobile or the electrical circuit is changed, the same bus bars 4 can be used as they are. Thus, with the electrical junction box of the invention, unlike the conventional one, it is not necessary to manufacture bus bars specially for a different model of an automobile or a different electrical circuit, with a result that the manufacturing cost is reduced. Since the number of kinds of bus bars is not increased, the mounting of the latter can be achieved correctly at all times.

Figure 3:
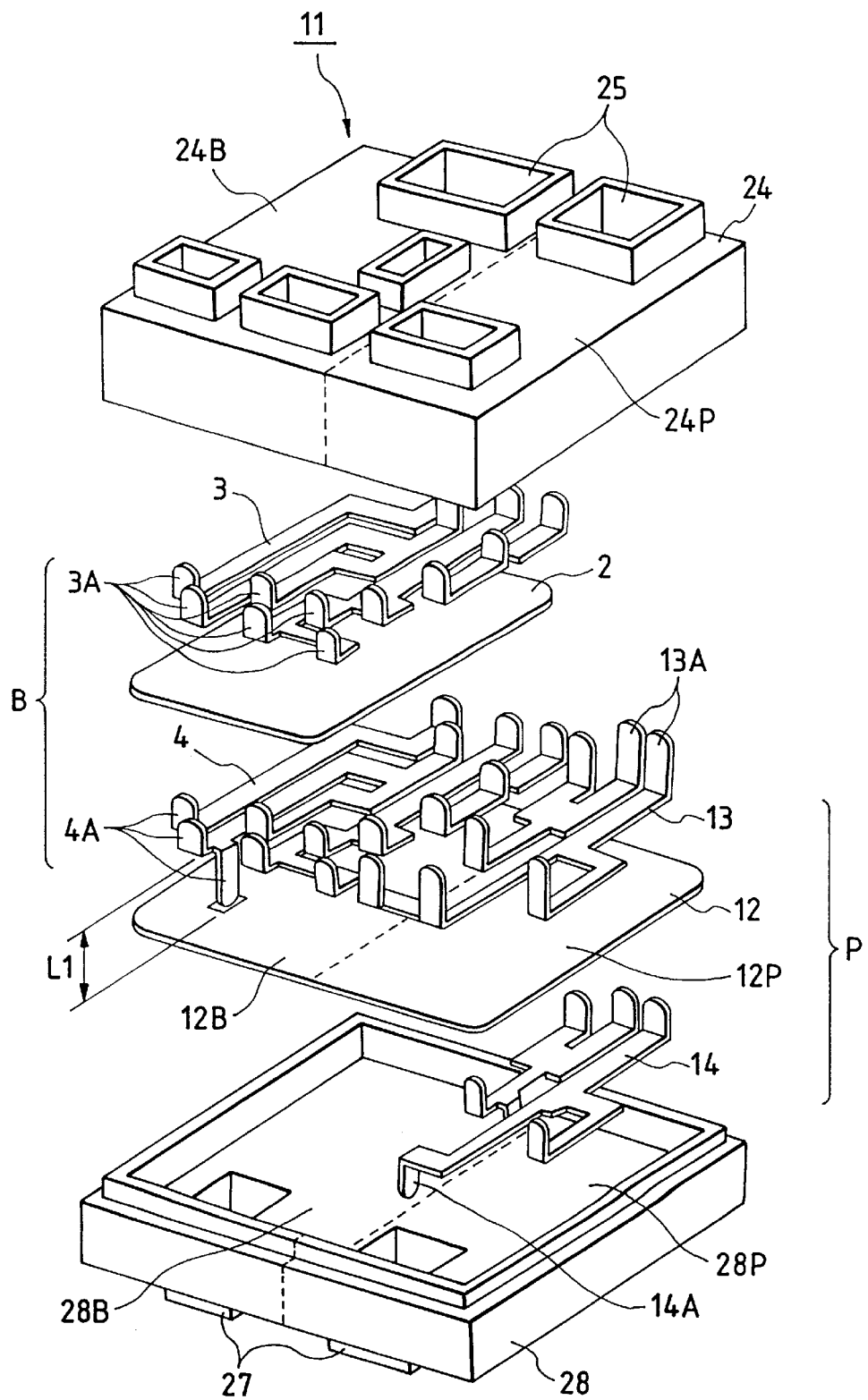
FIG. 3 is an exploded perspective view showing another example of the electrical junction box, which constitutes a second embodiment of the invention.
Figure 4:
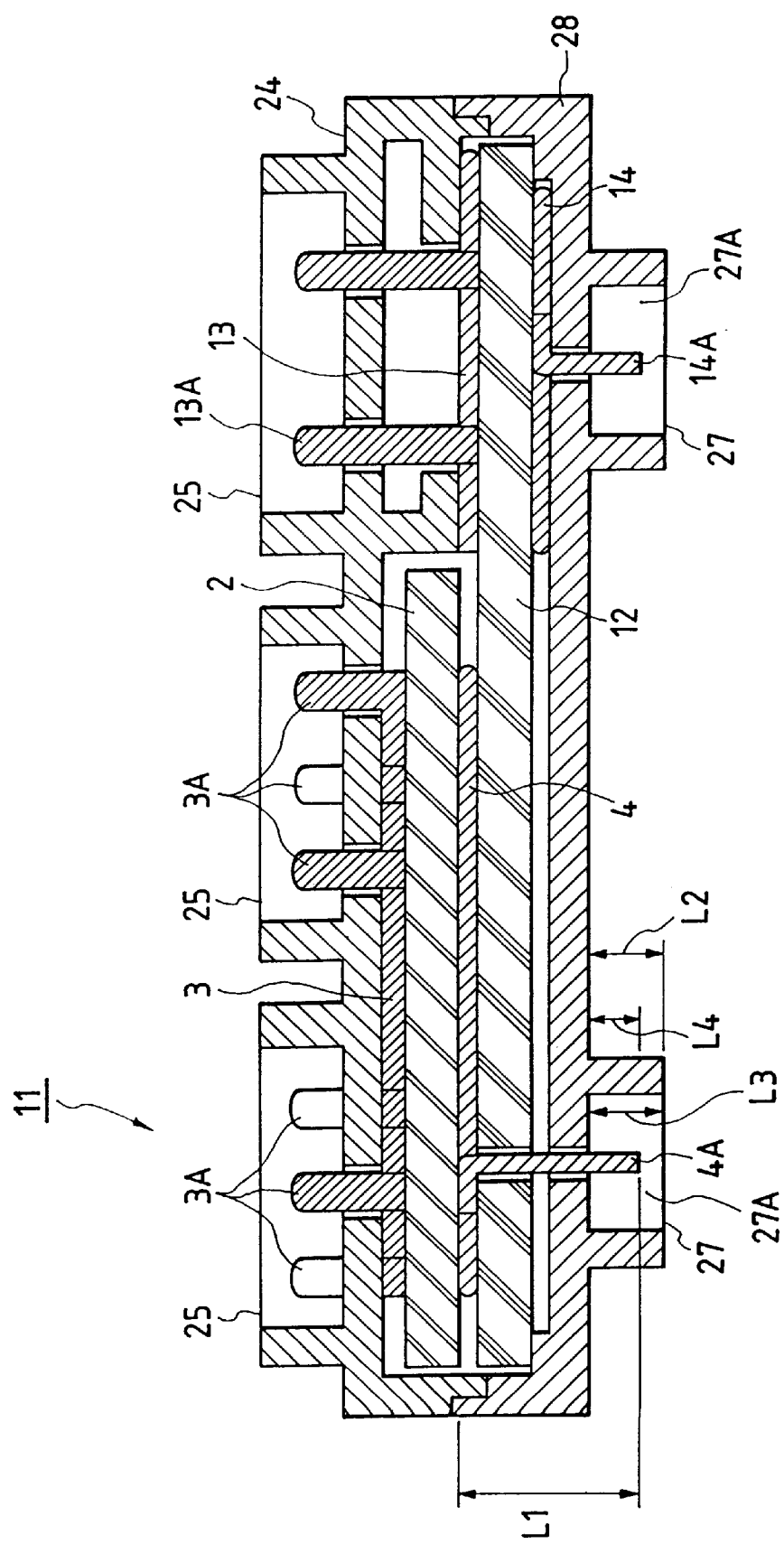
FIG. 4 is a sectional view of the electrical junction box shown in FIG. 3.

FIG. 3 is an exploded perspective view showing another example of the electrical junction box, which constitutes a second embodiment of the invention, and FIG. 4 is a sectional view of the electrical junction box shown in FIG. 3. The electrical junction box 11 shown in FIGS. 3 and 4 has more functions than those of the electrical junction box 1 shown in FIG. 1, thus being applicable to a luxury car.

In the electrical junction box 11, the above-described wiring board 2 in the electrical junction box 1 shown in FIG. 1 is employed as a common wiring board, and the bus bars 3 and 4 shown in FIG. 1 are employed as common bus bars; that is, the wiring board 2 and the bus bars 3 and 4 form a fundamental circuit. And an extended circuit is formed by adding an optional wiring board, and optional bus bars to the fundamental circuit.

More specifically, the electrical junction box 11, as shown in FIGS. 3 and 4, includes the common wiring board 2, and the common bus bars 3 and 4 on both sides of the common wiring board 2. The common wiring board 2, and the common bus bars 3 and 4 form the fundamental circuit B.

The electrical junction box 11 further includes an optional wiring board 12, and optional bus bars 13 and 14 arranged on both sides of the optional wiring board 12. The optional wiring board 12, as shown in FIG. 3, has a fundamental circuit region 12B, and an optional circuit region 12P. Thus, the electrical junction box 11 is increased in function with the optional wiring board 12 and the optional bus bars 13 and 14 (optional circuit P) added to the fundamental circuit B, being applicable to a luxury car.

In the fundamental circuit region 12B of the optional wiring board 12, the common wiring board 2 and the common bus bars 4 are partially laid on each other, so that the optional wiring board 12 is coupled to the fundamental circuit B.

A main cover 24 and an under cover 28 accommodate the wiring boards 2 and 12 and the bus bars 3, 4, 13 and 14. In correspondence to the regions of the optional wiring board, the main cover 24 has a fundamental circuit region 24B and an optional circuit region 24P. Accordingly, the fundamental circuit region 24B corresponds to the main cover 6 of the first embodiment shown in FIG. 1. A plurality of connector mounting frames 25 are formed on the upper surface of the two regions 24B and 24P of the main cover 24 in such a manner that they are opened upwardly.

Similarly to in the case of the main cover 24, the under cover 28 also has a fundamental circuit region 28B and an optional circuit region 28P. The fundamental circuit region 28B corresponds to the under cover 8 in the first embodiment shown in FIG. 1. A plurality of connector mounting frames 27 are formed on the lower surface of the two regions 28B and 28P of the under cover 28 in such a manner that they are opened downwardly.

The common bus bars 3 have a plurality of tabs 3A raised upwardly. Those tabs 3A are inserted in the connector mounting frames 25 when the common wiring board 2 and the common bus bars 3 are accommodated in the main cover 24.

The optional bus bars 13 arranged on the optional wiring board 12 also have a plurality of tabs 13A raised upwardly. The tabs 13A are longer than the tabs 3A of the common bus bars 3. Hence, the optional bus bars 13, being located below the common bus bars 3, have the same level as the tabs 3A in the connector mounting frames 25.

Each of the connector mounting frames 27 extended from the lower surface of the under cover 28, as shown in FIG. 4, has a length L3 which is shorter than the length L2 of the connector mounting frame 7 of the first embodiment shown in FIG. 2.

When the common bus bars 4 are accommodated in the under cover 28, the downwardly extended tab 4A is inserted into the connector mounting frame 27 through a through-hole formed in the fundamental circuit region 12B of the optional wiring board 12.

In this operation, since the length L1 of the tab 4A is sufficiently large as was described above, the tab 4A is exposed partially by a predetermined length L4 in the recess 27A which is formed by the connector mounting frame 27 to a predetermined depth L3.

That is, even if the electrical circuit to be accommodated is increased in function, the length L4 of the exposed part of the tab is maintained unchanged with the common bus bars employed as they are.

On the other hand, the tab 14A extended downwardly from the optional bus bars 14 arranged on the lower surface of the optional wiring board 12 is smaller in length than the tab 4A extended downwardly from the common bus bar 4. Hence, as shown in FIG. 4, the optional bus bar 14, being located below the common bus bars 4, have the same level as the tab 4A in the connector mounting frames 27.

Figure 8A:
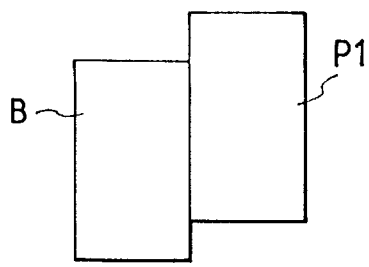
FIGS. 8(a) through 8(c) are explanatory diagrams showing combinations of a fundamental circuit and an optional circuit.
Figure 8B:
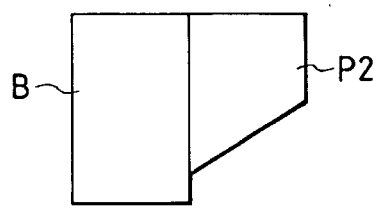
Figure 8C:
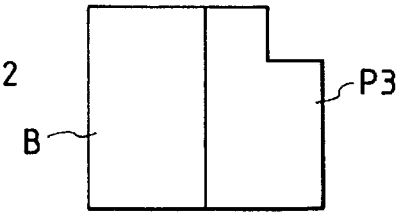

FIGS. 8(a) through 8(c) are explanatory diagrams showing possible combinations of the fundamental circuit B and the optional circuit P. As shown in FIG. 8(a), in a first example of the combinations, the optional circuit P1 is arranged staggered from the fundamental circuit B, and in second and third examples shown in FIGS. 8(b) and 8(c), the optional circuits are not uniform in configuration. More specifically, in the second example, the optional circuit P2 is obliquely cut off, and in the third example, the optional circuit P3 is partially cut off.

Those circuits variable in configuration are each accommodated between the main cover and the under cover which are designed therefor.

In the second embodiment designed as described above, the optional circuit P made up of the optional components is added to the fundamental circuit B made up of the common components which are provided for the standard model of an automobile, to provide the circuit extended in function.

Thus, according to the above-described manufacturing procedure, the electrical junction box 11 extended in function for a luxury car can be formed at low manufacturing cost.

Figure 5:
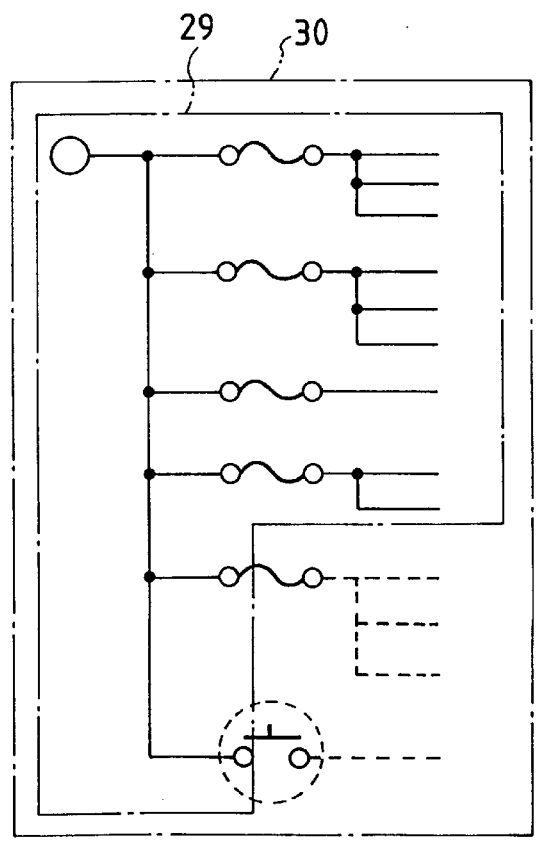
FIG. 5 is an explanatory diagram showing a common circuit and an extended circuit.

FIG. 5 is an explanatory diagram for a description of the common circuit and the extended circuit. In FIG. 5, reference numeral 29 designates the common circuit surrounded by the one-dot chain line, which corresponds to the electrical circuit in an automobile on a standard-quality specification; and 30, the extended circuit surrounded by the one-dot chain line, which corresponds to the electrical circuit in an automobile on a high-quality specification.

With the common bus bars 3 and 4 as shown in FIGS. 1 and 3 applied to the common circuit, a circuit extended in function can be formed merely by adding the optional components thereto in the above-described manner.

As is apparent from the above description, the electrical junction box of the invention, being formed by adding the optional components to the common bus bars, is applicable to all models of automobiles different in electrical circuit. This feature results in a reduction in manufacturing cost, and markedly improves the working efficiency.

In the above-described embodiments, the length of the connector mounting frame (7 or 27) of the under cover (8 or 28) is determined according to the common bus bar 4 (and the tab 4A); however, the invention is not limited thereto or thereby. That is, the length of the connector mounting frames (5 or 25) may be determined according to the common bus bars 3 (and the tabs 3A) on the side of the main cover (6 or 24). In addition, not only the lengths of the connector mounting frames (5 or 25) of the main cover (6 or 24) but also the lengths of the connector mounting frames (7 or 27) of the under cover (8 or 28) may be determined as was described above. Those determinations should be made with the tab length L1, the connector mounting frame length L2, and the recess depth L3 set to optimum values.

Figure 6:
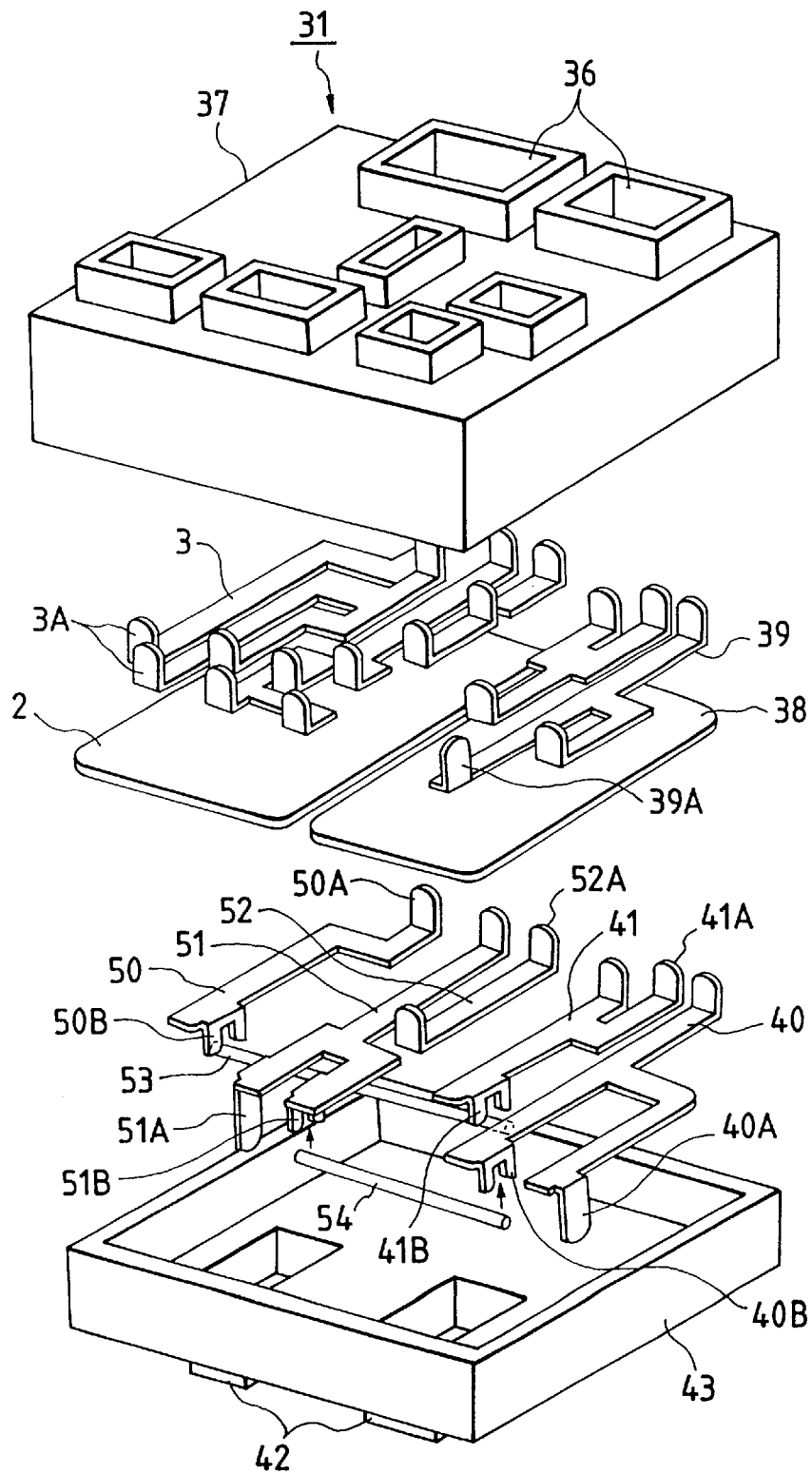
FIG. 6 is an exploded perspective view showing another example of the electrical junction box, which constitutes a third embodiment of the invention.

FIG. 6 is an exploded perspective view showing another example of the electrical junction box, which constitutes a third embodiment of the invention. The electrical junction box 31, as shown in FIG. 6, includes: a wiring board 2; bus bars 3 over the wiring board 2, and bus bars 50, 51 and 52 under the wiring board 2; a special wiring board 38; special bus bars 39 over the special wiring board 38, and special bus bars 40 and 41 under the special wiring board 38; and a main cover 37 and an under cover 43 accommodating those wiring boards and bus bars.

Those bus bars 3, 39, 40, 41, 50, 51 and 52 are independent of one another, and have tabs 3A, 39A, 40A, 41A, 50A, 51A and 52A raised respectively at the ends. Those tabs are inserted into connector mounting frames 36 and 42 formed on the main cover 37 and the under cover 43.

At least two of the bus bars each has at least a press-connecting blade. These press-connecting blades are electrically connected to each other by a coupling wire. In the electrical junction box shown in FIG. 6, for instance the bus bar 50 and the special bus bar 41 have press-connecting blades 50B and 41B, respectively, which are extended downwardly. An electrically conductive coupling wire 53 is pressed against the press-connecting blades 50B and 41B, so that the bus bars 50 and 41 are electrically connected to each other. Similarly, the bus bar 51 and the special bus bar 40 have press-connecting blades 51B and 40B, respectively, which are extended downwardly. An electrically conductive coupling wire 54 is pressed against the press-connecting blades 51B and 40B, so that the bus bars 51 and 40 are electrically connected to each other.

As was described above, the bus bars separated from each other can be electrically connected to each other through the press-connecting blades and the coupling wire. This means that the combination of the common bus bars and the special bus bars is markedly increased in the degree of freedom, and accordingly an electrical circuit more intricate in arrangement and higher in efficiency can be formed with ease. In addition, the electrical circuit thus formed can be readily modified, when necessary.

Figure 7:
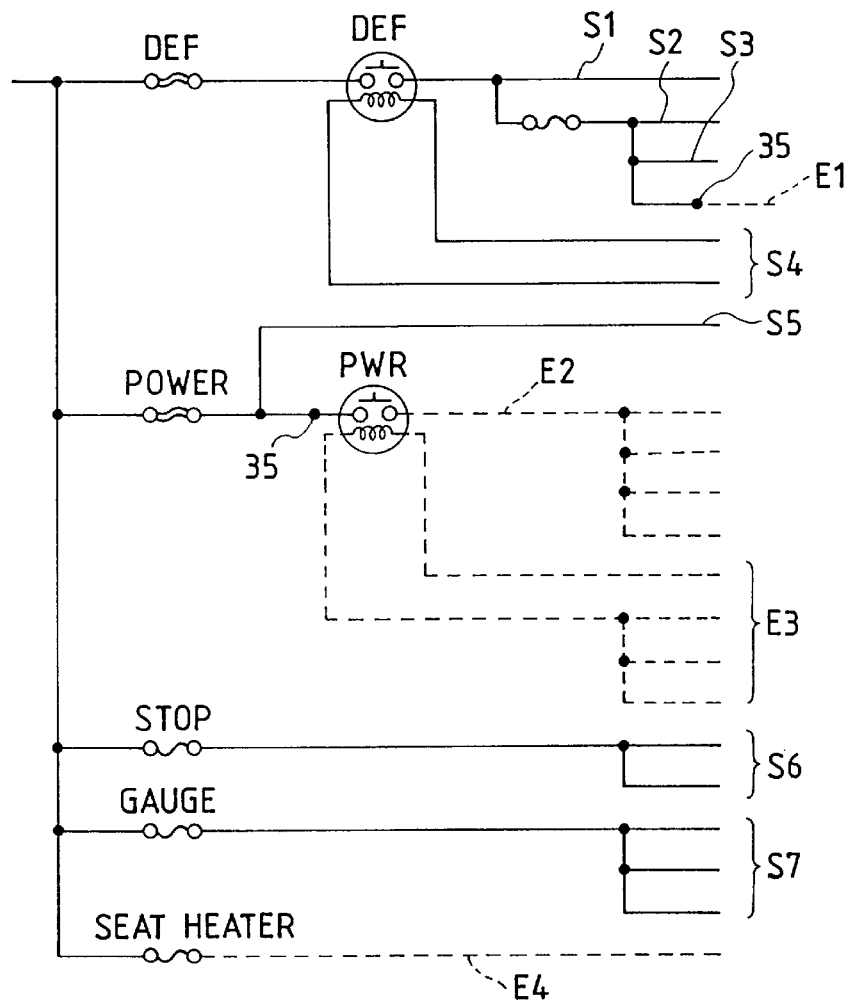
FIG. 7 an explanatory diagram showing an extended circuit in the electrical junction box shown in FIG. 6.

FIG. 7 is an explanatory diagram showing an extended electrical circuit which is formed in the electrical junction box by using the press-connecting blades and the coupling wires.

In FIG. 7, reference characters S1 through S7 designate the outputs of the common circuit, which include DEF, STOP, ECU-B, TAIL, ECU-IG, GAUGE, WIPER, TURN, CIG, RADIO, IGN and ST outputs.

Further in FIG. 7, reference characters E1 through E4 designate the outputs of the extended circuit, which include P/W, D/L, FOG, TRC, HTR, NAVI, SEAT HTR and CRT outputs.

As shown in FIG. 7, the output E1 is obtained through the coupling wire 35 from the output S2 or S3 of the common circuit, and the output E2 is obtained through the coupling wire 35 from the output S5 of the common circuit.

As was described above, with the electrical junction box of the invention, the electrical circuit can be readily extended in function by use of the press-connecting blades and the coupling wires. Hence, the electrical junction box can be readily applied to a different model of an automobile having a different electrical circuit, which reduces the manufacturing cost.

In assembling the electrical junction box, the common bus bars, the common main cover, and the common under cover are used, which contributes to a reduction in the number of components. As a result, the assembling work is greatly improved in work efficiency, and is free from a difficulty that inappropriate components are assembled. Accordingly, the probability that defective electrical junction boxes are manufactured is greatly decreased.

In the above-described third embodiment, for convenience in description, only the selected bus bars have the press-connecting blades; that is, the bus bars 50 and 51 and the special bus bars 40 and 41 on the side of the under cover 43 have the press-connecting blades 50B, 51B, 40B and 41B. However, the invention is not limited thereto or thereby. That is, the electrical junction box may be so modified that the bus bars 3 and the special bus bars 39 on the side of the main cover 37 have the press-connecting blades.

As is apparent from the above description, with the electrical junction box of the invention, the bus bars and the wiring board can be applied, as they are, to a different model of an automobile having a different electrical circuit, markedly reducing the manufacturing cost of the latter.

In assembling the electrical junction box, the common components (i.e., the bus bars and the wiring board) are used, so that the number of components is reduced as much. As a result, the difficulty is eliminated that inappropriate components are assembled. Accordingly, the probability that defective electrical junction boxes are manufactured is greatly decreased, and the assembling work is markedly improved in work efficiency.

What is claimed is:
1. An electrical junction box comprising:
a wiring board;

a plurality of bus bars arranged on said wiring board, each having a tab raised therefrom;

a main cover having a connector mounting frame into which said tab of one of said bus bars is inserted; and an under cover having a connector mounting frame into which said tab of another one of said bus bars is inserted;

wherein one of said connector mounting frames has a recess, such that one of said tabs includes an exposed part which extends into said recess; and wherein said one connector mounting frame and said exposed part of said tab have overall lengths, such that, when a distance between said one connector mounting frame and said bus bar with said exposed part of said tab is increased, (1) a depth of said recess and (2) a length of said exposed part of said tab are maintained by decreasing a thickness of a floor of said recess, thereby decreasing said overall length of said one connector mounting frame.

2. The electrical junction box according to claim 1, wherein said bus bars are arranged on both sides of said wiring board.

3. The electrical junction box according to claim 2, wherein the tab of at least one of said bus bars arranged on an upper surface side of said wiring board is inserted into the connector mounting frame of said main cover, and the tab of another one of said bus bars arranged on a lower surface side of said wiring board is inserted into the connector mounting frame of said under cover.

4. The electrical junction box according to claim 1, wherein said connector mounting frame of said under cover is provided with said recess.

5. The electrical junction box according to claim 1, wherein at least two of said bus bars each has at least one press-connecting blade, said press-connecting blades of said bus bars being electrically connected to each other by a coupling wire.

6. The electrical junction box according to claim 5, wherein said bus bars having the press-connecting blades are arranged on a lower surface side of said wiring board.

7. An electrical junction box comprising:

a fundamental circuit including a common wiring board, and a plurality of common bus bars arranged on said common wiring board, each of said common bus bars having a tab raised therefrom;

an option circuit including an option wiring board at least partially superposed with respect to said common wiring board, and a plurality of option bus bars arranged on said option wiring board, each of said option bus bars having a tab raised therefrom;

a main cover having a plurality of connector mounting frames, into one of which is inserted the tab of one of said common bus bars; and an under cover having a plurality of connector mounting frames, into one of which is inserted the tab of another of said common bus bars;

wherein the tab of one of said option bus bars is inserted into one of said connector mounting frames of said main cover and the tab of another of said option bus bars is inserted into one of said connector mounting frames of said under cover;

wherein two recesses are respectively provided in two of said connector mounting frames of one of said main cover and said under cover, a first recess of said two recesses is provided in one of said connector mounting frames into which the tab of one of said common bus bars is inserted, and a second recess of said two recesses is provided in one of said connector mounting frames into which the tab of one of said option bus bars is inserted, said first and said second recesses having equal depths and exposing an equal length of a portion of the respective tab therein.

8. The electrical junction box according to claim 7, wherein said two recesses are provided in said connector mounting frames of said under cover.

9. The electrical junction box according to claim 5, wherein said option circuit is arranged staggered from said fundamental circuit.

10. The electrical junction box according to claim 5, wherein said option circuit is obliquely cut off.

11. The electrical junction box according to claim 5, wherein said option circuit is partially cut off.

12. The electrical junction box according to claim 7, wherein said common bus bars are arranged on both sides of said common wiring board, and said option bus bars are arranged on both sides of said option wiring board.

13. The electrical junction box according to claim 12, wherein the tab of one of said common bus bars arranged on an upper surface side of said common wiring board is inserted into one of said connector mounting frames of said main cover, and the tab of one of said common bus bars arranged on a lower surface side of said common wiring board is inserted into one of said connector mounting frames of said under cover.

14. The electrical junction box according to claim 7, wherein at least two of said bus bars each has at least one press-connecting blade, said press-connecting blades of said bus bars being electrically connected to each other by a coupling wire.

15. The electrical junction box according to claim 14, wherein said bus bars having the press-connecting blades are arranged on a lower surface side of one of said common wiring board and said option wiring board.

* * * * *